United States Patent [19]

Roskell

[11] Patent Number: 5,668,482

[45] Date of Patent: Sep. 16, 1997

[54] BUS MAINTENANCE CIRCUIT

[75] Inventor: Derek Roskell, Northants, United Kingdom

[73] Assignee: Texas Instruments Incorporated, Dallas, Tex.

[21] Appl. No.: 616,410

[22] Filed: Mar. 15, 1996

[51] Int. Cl.$^6$ .................................................. H03K 17/04
[52] U.S. Cl. .................................. 326/31; 326/17; 326/82; 326/86
[58] Field of Search ................................ 326/16–17, 21, 326/31, 34, 82, 86

[56] References Cited

U.S. PATENT DOCUMENTS

| | | | |
|---|---|---|---|
| 4,598,216 | 7/1986 | Lauffer et al. | 326/21 X |
| 4,621,202 | 11/1986 | Pumo | 326/86 |
| 4,647,797 | 3/1987 | Sanwo et al. | 326/86 |
| 4,766,334 | 8/1988 | Warner | 326/86 X |
| 5,440,182 | 8/1995 | Dobbelaere | 326/17 X |
| 5,498,976 | 3/1996 | Hwang | 326/82 X |
| 5,511,170 | 4/1996 | Abdoo | 395/280 |
| 5,532,630 | 7/1996 | Waggoner et al. | 327/108 |

*Primary Examiner*—David R. Hudspeth
*Attorney, Agent, or Firm*—Richard L. Donaldson; William B. Kempler

[57] ABSTRACT

A maintenance circuit for a bus (1) with a tristate driver (2) which includes a keeper circuit (3) having a first inverting logic gate (4) with an input connected to the bus (1) and a second inverting logic gate (5) with an input (6) connected to the output of the first logic gate (4). The output of the second logic gate (5) is restricted in current relative to that of tristate driver (2) and is connected directly to the bus (1). The keeper circuit (3) has a control input (7) for disabling positive feedback therein, such that the keeper circuit (3) acts as a pull-up or pull-down circuit.

14 Claims, 1 Drawing Sheet

BUS MAINTENANCE CIRCUIT

The present invention relates to keeper circuits for tristate buses.

BACKGROUND OF THE INVENTION

A tristate bus is a conductor to which are connected the outputs of a plurality of tristate drivers. Each tristate driver can adopt any one of three states which are: two active states, one asserting a logic "1" on the bus, and one asserting a logic "0" on the bus, and a high impedance state in which the driver has no influence on the logic state of the bus and imposes substantially no load on any other driver driving the bus to a logic level. In operation usually either only one of the drivers is active while the others are in the high impedance state, or all of the drivers are in the high impedance state. In the latter case the potential on the bus may drift to a value intermediate between the "0" and "1" logic levels. That may be undesirable for circuits receiving data from the bus because the logic level on the bus is undefined. For example, an intermediate level on the bus may cause both the n-channel and p-channel transistors in a CMOS logic gate to be turned on, which is wasteful of power and may even destroy the transistors. To alleviate those problems a keeper circuit is attached to the bus. A keeper is a circuit that latches the logic level placed on the bus by an active tristate driver and maintains that logic level on the bus after that driver is switched to its high impedance state until that driver or one of the other drivers is switched to the other logic level.

A need for the present invention arises in integrated circuits that have tristate buses and that have built-in scan test facilities of the type in which test data is shifted directly into latches of the integrated circuit. Such latches may be used otherwise in the normal functioning of the circuit or may be specially provided. Test data in the form of particular patterns of bits, known as a test vector, is shifted into the latches and is then presented to the combinational logic and conductors of the circuit. The emerging pattern of bits is captured by the latches and the captured pattern of bits is then shifted out of the circuit to be analysed to check that the circuit is functioning correctly. The test bit patterns and analysis are usually provided by a suitably programmed computer. To test a circuit fully many different or all possible scan vectors have to be presented to the circuit and the results from each analysed.

The scan testing of circuits having a tristate bus has particular problems. In most circuits many, typically 10%, of the scan vectors applied to the logic of the circuit result in all the tristate drivers connected to the bus being switched to their high impedance state. When a test vector causes all the tristate drivers to be switched to the high impedance state, the value on the bus is that maintained on the bus by its keeper which is the value placed on the bus in response to the previous test vector. Test pattern generation and analysis programs do not, however, take into account values stored in the circuit from previous test vectors. Therefore when all the tristate drivers are in the high impedance state, the value on the bus is undefined as far as the program is concerned making it impossible to test combinational logic that takes the value on the bus as an input. The tristate drivers themselves are also difficult to test. A test of a tristate driver is to enable that driver only, apply a known value to its input and check the value the driver outputs to the bus or some value derived by the circuit from that value. If the bus has a keeper, however, it is not clear whether a value detected at the output of an enabled tristate driver is that at its input or whether the detected value is that maintained on the bus by the keeper from an earlier test because the driver is faulty and is in fact in the high impedance state.

SUMMARY OF THE INVENTION

In a first aspect the present invention provides a circuit comprising, a bus, a tristate driver having its output connected to the bus, and a keeper circuit comprising a first inverting logic gate means having an input connected to the bus, and a second inverting logic gate means having an input connected to the output of the first inverting logic gate means and an output restricted in current relative to that of the tristate driver and connected directly to the bus, wherein the keeper has a control input for enabling or disabling positive feedback in the keeper circuit, and the circuit is such that when the positive feedback is disabled the keeper circuit acts as a pull-up or a pull-down circuit.

When a particular logic value is presented to the control input so that the keeper circuit has positive feedback around the loop formed by the first and second logic gate means, the keeper circuit serves to maintain the logic level on the bus. When the other logic value is presented to the control input the circuit behaves as a pull-up, or pull-down, for the bus, depending on the type of logic gates used for the circuit.

The pull-up or pull-down behaviour provides a way of placing a known logic level on the bus. In the case of circuits that are scan testable that enables both the tristate drivers and combinational logic that takes the value on the bus as an input to be tested.

The first or second logic gate means may have a second input which may be connected to the control input. In a second aspect the present invention provides a keeper circuit comprising a terminal, and a loop comprising a first inverting logic gate means having an input connected to the terminal, and a second inverting logic gate means having an input connected to the output of the first inverting logic gate means and an output restricted in current relative to that of the first logic gate means and connected directly to the terminal, wherein the keeper circuit has a control input for enabling or disabling positive feedback in the keeper circuit, the first or the second inverting logic gate means having a second input connected to the control input, and the circuit being such that when positive feedback is disabled the keeper circuit acts as a pull-up or a pull-down circuit.

In a third aspect the present invention provides a circuit comprising, a bus, a tristate driver having its output connected to the bus, and a circuit according to the second aspect of the invention.

In each aspect of the invention the inverting logic gate means having the said second input may be a NAND gate means or a NOR gate means.

The one of the first and second inverting logic gate means other than the inverting logic gate means having the said second input may be a NOT gate means.

The one of the first and second inverting logic gate means other than the inverting logic gate means having the said second input may itself have a second input.

The first and second inverting logic gate means may both be NAND gate means.

The keeper circuit may comprise a NAND gate means having its output connected to the input of a first NOT gate means, itself having its output connected to an input of a NOR gate means, which has its output connected to the input of a second NOT gate means, with the output of the second NOT gate means connected to an input of the NAND gate means, the NOR gate means or the second NOT gate means having the said restricted output.

In the first aspect of the invention the first and second logic gate means may both be NOT gate means each having its output restricted in current relative to that of the tristate driver and the keeper circuit may include either or both of a PMOS transistor the channel of which selectively connects the output of the first logic gate means to the positive supply rail and an NMOS transistor the channel of which selectively connects the output of the first logic gate means to the negative supply rail, the or one of the gates of those transistors forming the said control input.

In any aspect of the invention, the circuit may have means for allowing the circuit to be scan tested, and may then be arranged to enable a scan clock signal to be connected to the or one of the inverting logic gate means having a second input, or be arranged to provide a constant signal to the control input while the circuit is being scan tested.

BRIEF DESCRIPTION OF THE DRAWINGS

There will now be described, by way of example only, circuits according to the present invention, with reference to the accompanying drawings of which.

DESCRIPTION OF THE PREFERRED EMBODIMENTS

Figures 1, 2:
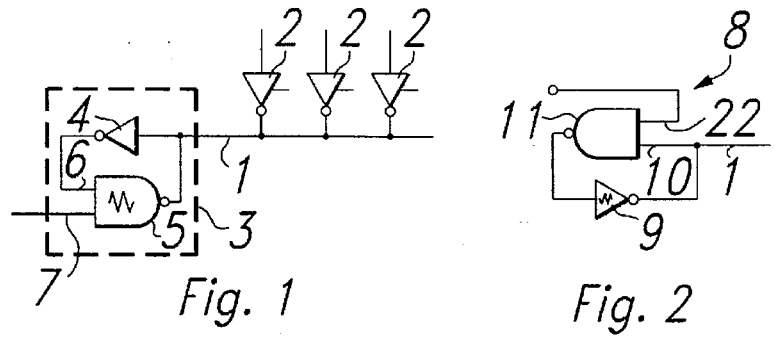
FIG. 1 is a diagram of a tristate bus and an associated keeper circuit.
FIGS. 2, 3, and 4 are circuit diagrams of keepers any one of which may be used in the circuit of FIG. 1 as an alternative to the keeper shown there.

FIG. 1 shows a bus or common conductor 1. Several tristate drivers 2 are provided having their outputs connected to the bus 1. A keeper circuit 3 is also connected to the bus 1. The keeper circuit comprises an inverter 4 having its input connected to the bus 1 and a NAND gate 5 having a first one 6 of its two inputs 6 and 7 connected to the output of the inverter.

The NAND gate 5 is constructed to have a limited current output, which is denoted in FIG. 1 by the resistor symbol within the NAND gate. In CMOS construction the output of a NAND gate is taken from a node between a PMOS and an NMOS transistor connected in series. The current output of a CMOS NAND gate may be limited by forming the drain of the NMOS transistor driving the output of the NAND gate to be narrower than the drain of the corresponding transistor in each of the drivers 2. The limitation on the output current may be achieved in other ways, for example, by providing a resistor in the output conductor of the NAND gate leading from the node between the NMOS and the PMOS transistors.

The limited current output of the NAND gate 5 ensures that if any of the tristate drivers 2 is in an active state then it is the logic level output by that driver that appears on the bus, overriding if necessary the output of the keeper.

When a logic value is being asserted by a tristate driver 2, that value is inverted by the inverter 4 and the inverted value is presented to the first input 6 of the NAND gate 5. In the normal operation of the circuit the second input 7 of the NAND gate 5 is held at a logic "1" with the result that the NAND gate tries to invert the value presented at its first input 6. Because the value asserted on the bus 1 is inverted twice around the loop connecting the inverter 4 and the NAND gate 5, the value that the NAND gate tries to output is the same as that asserted on the bus and so the NAND gate serves to maintain that value.

If now the active tristate driver 2 is switched to its high impedance state and the other tristate drivers remain in that state, the NAND gate 5 continues to maintain the bus 1 at the logic level previously asserted by the tristate driver 2. That is a stable state owing to the positive feedback around the loop connecting the inverter 4 and the NAND gate 5.

If, instead, the second input 7 of the NAND gate 5 is held at a logic "0", the keeper circuit behaves as a pull-up circuit. When a logic "0" is presented to its second input 7 the NAND gate 5 will always try to output a logic "1" irrespective of the value presented to its first input 6. Thus when a tristate driver 2 asserting a logic "0" on the bus 1 is switched to its high impedance state, the NAND gate 5 will pull the bus up to a logic "1" state.

In circuits having scan test facilities, the keeper circuit may be used as just described while a test is in progress to ensure that there is a logic "1" state on the bus when all the tristate drivers are in the high impedance state.

FIG. 2 is a diagram of a keeper circuit 8 that may be used instead of the keeper circuit 3 in the circuit of FIG. 1. The keeper circuit 8, comprises an inverter 9 having an output of limited Current connected to a first input 10 of an ordinary NAND gate 11 whose output is connected to the input of the inverter 9. The keeper circuit 8 is connected to the bus 1 at the output of the inverter 9. The NAND gate 11 also has a second input 22, which input 22 is used to control the behaviour of the keeper 8.

Like the keeper 3, the keeper 8 acts as such when logic "1" is presented to the second input 22 of the NAND gate. When logic "0" is presented to that input, the keeper 8 acts, however, as a pull-down circuit for the bus 1. That is because the logic "0" forces logic "1" at the output of the NAND gate 11, which results in the current limited inverter 9 trying to produce logic "0" on the bus 1.

Figures 3, 4:
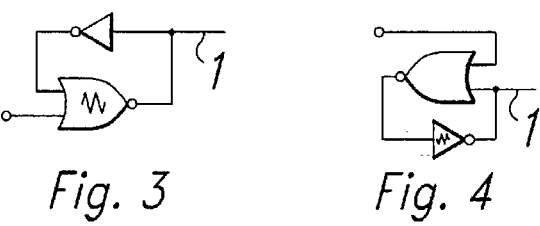

FIGS. 3 and 4 are diagrams of two further keeper circuits which are of the same construction as those of FIGS. 1 and 2 except that the two-input NAND gates are replaced by a current limited two-input NOR gate and normal two-input NOR gate respectively.

Both of the circuits of FIGS. 3 and 4 act as keepers when logic "0" is presented to the input of the NOR gate not connected to the output of the inverter. When logic "1" is presented to that input the circuit of FIG. 3 acts as a pull-down circuit and the circuit of FIG. 4 as a pull-up circuit.

In a circuit having built-in scan test facilities, the signals provided by the test computer, or signals derived therefrom, may be used to provide the control input for the keeper circuit for switching it between its keeper and pull-up/down modes of operation. In most cases a constant signal holding the keeper in pull-up/down mode during scan testing is desirable. In the case of circuits where the test data is scanned along latches of the master-slave type and valid test data is placed on a tristate bus during the slave phase, it is desirable that the keeper connected to that tristate bus act as a pull-up/down only during the slave phase reverting to a keeper during the master phase. Since during scan testing the master and slave phases of the latches of a circuit are determined by a test clock signal generated by the test computer, a suitable control signal for the keeper may be derived from that test clock signal.

Figure 5:
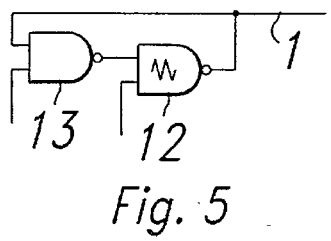
FIGS. 5, 6 and 7 are circuit diagrams of keeper circuits to which control signals are applied to select between keeper, pull-up and pull-down modes of operation, each of which circuits may also be used in the circuit of FIG. 1 as an alternative to the keeper shown there.
Figure 6:
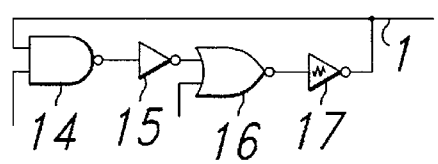
Figure 7:
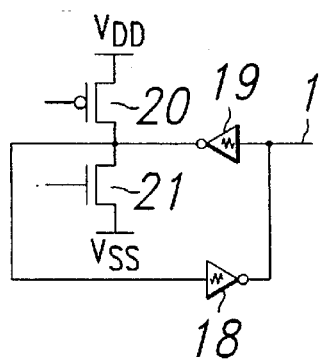

FIGS. 5, 6 and 7 are circuit diagrams of keeper circuits having more than one control input that allow selection not only of whether the circuit acts as a keeper or a pull-up/down but also of whether the circuit pulls up or pulls down.

The circuit of FIG. 5 comprises a current limited NAND gate 12 and an ordinary NAND gate 13, each having their outputs connected to a first input of the other. The output of the NAND gate 12 is connected to a terminal for connection to a bus 1. The second inputs of the two gates are used to control the mode of operation of the circuit. Presenting logic "0" to the second input of the NAND gate 12 results in the circuit behaving as a pull-up circuit irrespective of the logic level presented to the second input of the NAND gate 13. If logic "1" is presented to the second input of the NAND gate 12, then the circuit will act as a pull-down circuit, or a keeper, if logic "0", or "1" respectively, is presented to the second input of the NAND gate 13.

The circuit of FIG. 6 has a NAND gate 14, an inverter 15, a NOR gate 16 and a current limited inverter 17 connected in a loop. The output of the current limited inverter 17 is connected to a terminal for connection to a bus 1. The circuit acts a pull-up circuit if logic "1" is presented to the second input of the NOR gate 16, and if logic "0" is presented to that input as a pull-down, or a keeper, depending on whether logic "0", or "1" respectively, is presented to the second input of the NAND gate 14.

A circuit like that of FIG. 6 except that the NOR gate 16 has a restricted output instead of the inverter 17 will also act as a keeper, a pull-up or a pull-down depending on the logic levels presented to the second inputs of the NOR gate and the NAND gate. In this case the bus should be connected to the output of the NOR gate.

The circuit of FIG. 7 is constructed using CMOS technology and has two inverters 18 and 19 connected in a loop. Both of those inverters have outputs that are limited in current. The output of the inverter 18 is connected to a node for connection to a bus 1. A PMOS transistor 20 has its source connected to the positive supply rail $V_{DD}$ and its drain connected to the output of the inverter 19. An NMOS transistor 21 has its drain also connected to the output of the inverter 19 and has its source connected to the negative supply rail $V_{SS}$.

This circuit behaves as a keeper when both the PMOS transistor 20 and the NMOS transistor are turned off, which is achieved by presenting logic "1" and logic "0" to their respective gates. Turning on the PMOS transistor 20 results, since the inverter 19 has a restricted output, in the output of that inverter being pulled-up to logic "1". That logic level is then inverted by inverter 18, so the circuit behaves as a pull down unless, of course, inverter 18 is overridden by a tristate driver asserting the bus. Turning on the NMOS transistor 21 results in the output of the inverter 19 being pulled down and hence the circuit behaving as a pull up. The turning on of both the PMOS transistor 20 and the NMOS transistor 21 is avoided as that would short the supply rails.

If a keeper circuit that acts also as a pull-down or a pull-up only is required then either the PMOS transistor 20 the NMOS transistor 21 may be omitted.

I claim:

1. A circuit comprising, a bus, a tristate driver having its output connected to the bus, and a keeper circuit comprising, a first inverting logic gate means having an input connected to the bus, and a second inverting logic gate means having an input connected to the output of the first inverting logic gate means and an output restricted in current relative to that of the tristate driver and connected directly to the bus, wherein the keeper circuit has a control input for enabling or disabling positive feedback in the keeper circuit, and the circuit is such that when the positive feedback is disabled the keeper circuit acts as a pull-up or a pull-down circuit.

2. A keeper circuit as claimed in claim 1, wherein the first or second logic gate means has a second input, and wherein that second input is connected to the control input of the keeper circuit.

3. A circuit as claimed in claim 2, wherein the inverting logic gate means having the said second input is a NAND gate means.

4. A circuit as claimed in claim 2, wherein the inverting logic gate means having the said second input is a NOR gate means.

5. A circuit as claimed in claim 2, wherein the one of the first and second inverting logic gate means other than the inverting logic gate means having the said second input is a NOT gate means.

6. A circuit as claimed in claim 2, wherein the one of the first and second inverting logic gate means other than the inverting logic gate means having the said second input has itself a second input.

7. A circuit as claimed in claim 2, wherein the first and second logic gate means are both NAND gate means.

8. A circuit as claimed in claim 2, comprising a NAND gate means having its output connected to the input of a first NOT gate means having its output connected to an input of a NOR gate means having its output connected to the input of a second NOT gate means wherein the NOR gate means or the second NOT gate means is the inverting logic gate means having the restricted output.

9. A circuit as claimed in claim 1, wherein the first and second logic gate means are both NOT gate means each having its output restricted in current relative to that of the tristate driver and wherein the keeper circuit includes either or both of a PMOS transistor the channel of which selectively connects the output of the first logic gate means to the positive supply rail and an NMOS transistor the channel of which selectively connects the output of the first logic gate means to the negative supply rail, the or one of the gates of those transistors forming the said control input.

10. A circuit as claimed in claim 1 having means for enabling the circuit to be scan tested.

11. A circuit as claimed as in claim 10 arranged to enable a scan clock signal to be connected to the control input.

12. A circuit as claimed in claim 10 arranged to provide a constant signal to the control input while the circuit is being scan tested.

13. A keeper circuit comprising, a terminal, and a loop comprising, a first inverting logic gate means having an input connected to the terminal, and a second inverting logic gate means having an input connected to the output of the first inverting logic gate means and an output restricted in current relative to that of the first logic gate means and connected directly to the terminal, wherein the keeper circuit has a control input for enabling or disabling positive feedback in the keeper circuit, the first or the second inverting logic gate means having a second input connected to the control input, and the circuit being such that when the positive feedback is disabled the keeper circuit acts as a pull-up or a pull-down circuit.

14. A circuit comprising, a bus, a tristate driver having its output connected to the bus, and a keeper circuit as claimed in claim 13.

* * * * *